(12) United States Patent
Bieswanger et al.

(10) Patent No.: US 7,624,318 B2
(45) Date of Patent: Nov. 24, 2009

(54) METHOD AND APPARATUS FOR AUTOMATICALLY IDENTIFYING MULTIPLE COMBINATIONS OF OPERATIONAL AND NON-OPERATIONAL COMPONENTS ON INTEGRATED CIRCUIT CHIPS WITH A SINGLE PART NUMBER

(75) Inventors: Andreas Bieswanger, Ehningen (DE); Herwig Elfering, Offendorf (FR); James Stephen Fields, Jr., Austin, TX (US); Andrew J. Geissler, Austin, TX (US); Alan Hlava, Mazeppa, MN (US); Scott Barnett Swaney, Catskill, NY (US)

(73) Assignee: International Business Machines Corporation, Armonk, NY (US)

( * ) Notice: Subject to any disclaimer, the term of this patent is extended or adjusted under 35 U.S.C. 154(b) by 813 days.

(21) Appl. No.: 11/236,449

(22) Filed: Sep. 27, 2005

(65) Prior Publication Data

US 2007/0073501 A1  Mar. 29, 2007

(51) Int. Cl.
*G11C 29/00* (2006.01)
*G06F 11/00* (2006.01)
*G01R 31/28* (2006.01)

(52) U.S. Cl. .............. 714/723; 714/8; 714/30; 714/36; 714/42; 714/733; 714/742

(58) Field of Classification Search ........... 714/725, 714/733, 742, 8, 30, 36, 42
See application file for complete search history.

(56) References Cited

U.S. PATENT DOCUMENTS

| | | | | |
|---|---|---|---|---|
| 4,493,075 A | * | 1/1985 | Anderson et al. | 714/711 |
| 5,996,096 A | * | 11/1999 | Dell et al. | 714/710 |
| 6,078,540 A | * | 6/2000 | Keeth | 365/226 |
| 6,097,647 A | * | 8/2000 | Zagar et al. | 365/201 |
| 6,550,020 B1 | | 4/2003 | Floyd et al. | |
| 7,124,336 B2 | * | 10/2006 | Adler et al. | 714/723 |
| 7,269,765 B1 | * | 9/2007 | Charlton et al. | 714/710 |
| 7,305,600 B2 | * | 12/2007 | Farnsworth et al. | 714/726 |

FOREIGN PATENT DOCUMENTS

CN  1375085  10/2002

OTHER PUBLICATIONS

"Capacity Upgrade on Demand", IBM China Support Center, Dec. 31, 2004 www.ibm.com/eserver/iseries/hardware/ondemand.
"IBM eserver pSeries 640 offers significant performance improvements for e-business, application service providers and telecommunications", IBM hardware announcement, Oct. 3, 2000, pp. 1-5 http://www.01.ibm.com/cgi-bin/common/ssi/ssialias?infotype=an&subtype=ca&htmlfid=897/ENUS100-288&appname=isource&language=enus.

* cited by examiner

*Primary Examiner*—John J Tabone, Jr.
(74) *Attorney, Agent, or Firm*—Yee & Associates, P.C.; Matthew W. Baca

(57) ABSTRACT

A computer implemented method, a data processing system, and a computer usable program code for automatically identifying multiple combinations of operational and non-operational components with a single part number. A non-volatile storage is provided on a part, wherein the part includes a plurality of sub-components. Unavailable sub-components in the plurality of sub-components are identified based on a series of testing to form identified unavailable sub-components. Information of the identified unavailable sub-components is stored into the non-volatile storage.

20 Claims, 11 Drawing Sheets

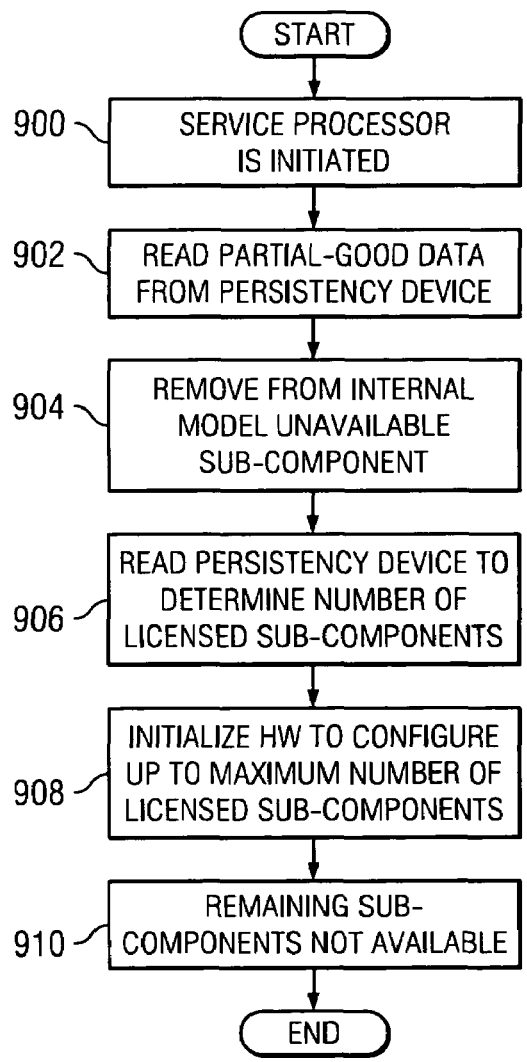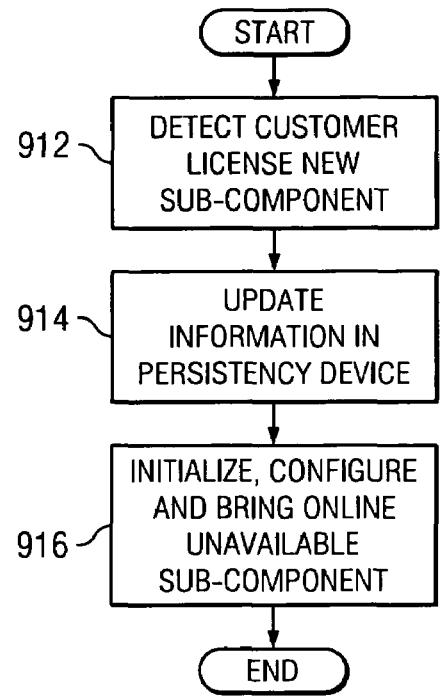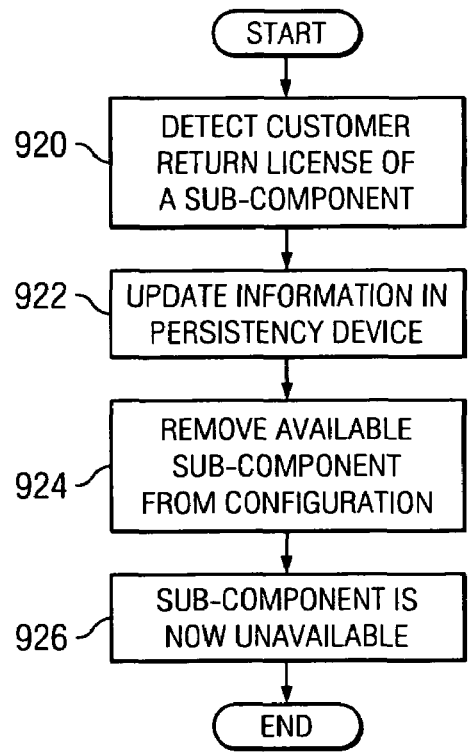

METHOD AND APPARATUS FOR AUTOMATICALLY IDENTIFYING MULTIPLE COMBINATIONS OF OPERATIONAL AND NON-OPERATIONAL COMPONENTS ON INTEGRATED CIRCUIT CHIPS WITH A SINGLE PART NUMBER

BACKGROUND OF THE INVENTION

1. Field of the Invention

The present invention relates generally to integrated circuit chips. In particular, the present invention relates to manufacturing and testing of integrated circuit chips. Still more particularly, the present invention relates to automatically identifying multiple combinations of operational and non-operational components on integrated circuit chips with a single part number.

2. Description of the Related Art

Currently, an integrated circuit chip or a part is designed to include one or more sub-components. A sub-component is a component that performs a specific function on the integrated circuit chip. Examples of the sub-components include processor cores, cache slices, and chip modules. Advances in chip technology enable an increased number of transistors per chip. This is exploited in the design of integrated circuit chips with placing more sub-components on a single chip. Increasing the transistor count of a chip, however, also increased the chance of defective parts. Thus, only a small number of integrated circuit chips pass the testing process without any problem being identified.

Other integrated circuit chips may contain one or more sub-components that are defective. These integrated circuits are known as partial good parts. In most cases, the partial good parts are either scrapped or reworked. The problem with scrapping or reworking partial good parts is obviously associated scrapping cost, limitations to the supply chain, and the ability to ship products. In other instances, partial good parts may still be used in products to reduce costs. In those instances, different combinations of operational and non-operational sub-components are formed and each combination is assigned a unique part number.

For example, in a chip that has two processor cores, processor core A and processor core B, three part numbers are assigned. The first part number is assigned to a first combination where both processor cores are functional. The second part number is assigned to a second combination where processor core A is defective, but processor core B is functional. The third part number is assigned to a third combination where processor core A is functional, but processor core B is defective.

The problem of assigning a unique part number to different combinations of operational and non-operational sub-components is the high number of part numbers that are generated as a result. This problem causes substantial administrative overhead, including overhead in the ordering process or customer service inventory. In addition, assigning each combination with a unique part number does not scale well for future designs where a higher number of replicated sub-components are anticipated, for example, four core chips. Furthermore, assignment of unique part numbers complicates or restricts higher-level assembly part numbers that use more than one partial-good part.

Alternative to assigning unique part numbers to different combinations of operational and non-operational sub-components, information of the defective sub-components may be stored on other persistent storage in a system. One example of a persistent storage is a database that is separate from the part. The separate database is used in various stages of the testing and manufacturing process for storing data. The problem with storing information of defective sub-components in a separate database is that in cases where the part or assembly is moved to a different system, an additional mechanism is needed in order to transfer defective sub-component information to the new system or assembly. In addition, a connection is required between the system using the part and the database in order to update or retrieve data. This transfer of defective sub-component information is error-prone and may require a significant amount of infrastructure to be in place for handling the information.

SUMMARY OF THE INVENTION

A computer implemented method, a data processing system, and a computer usable program code for automatically identifying multiple combinations of operational and non-operational components with a single part number. A non-volatile storage is provided on a part, wherein the part includes a plurality of sub-components. Unavailable sub-components in the plurality of sub-components are identified based on a series of testing to form identified unavailable sub-components. Information of the identified unavailable sub-components is stored into the non-volatile storage.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 9A-9C are flowcharts of processes for a concurrent update on demand (CuOD) use case enabled by aspects of the present invention in accordance with an illustrative embodiment of the present invention.

DETAILED DESCRIPTION OF THE PREFERRED EMBODIMENT

Figure 1:
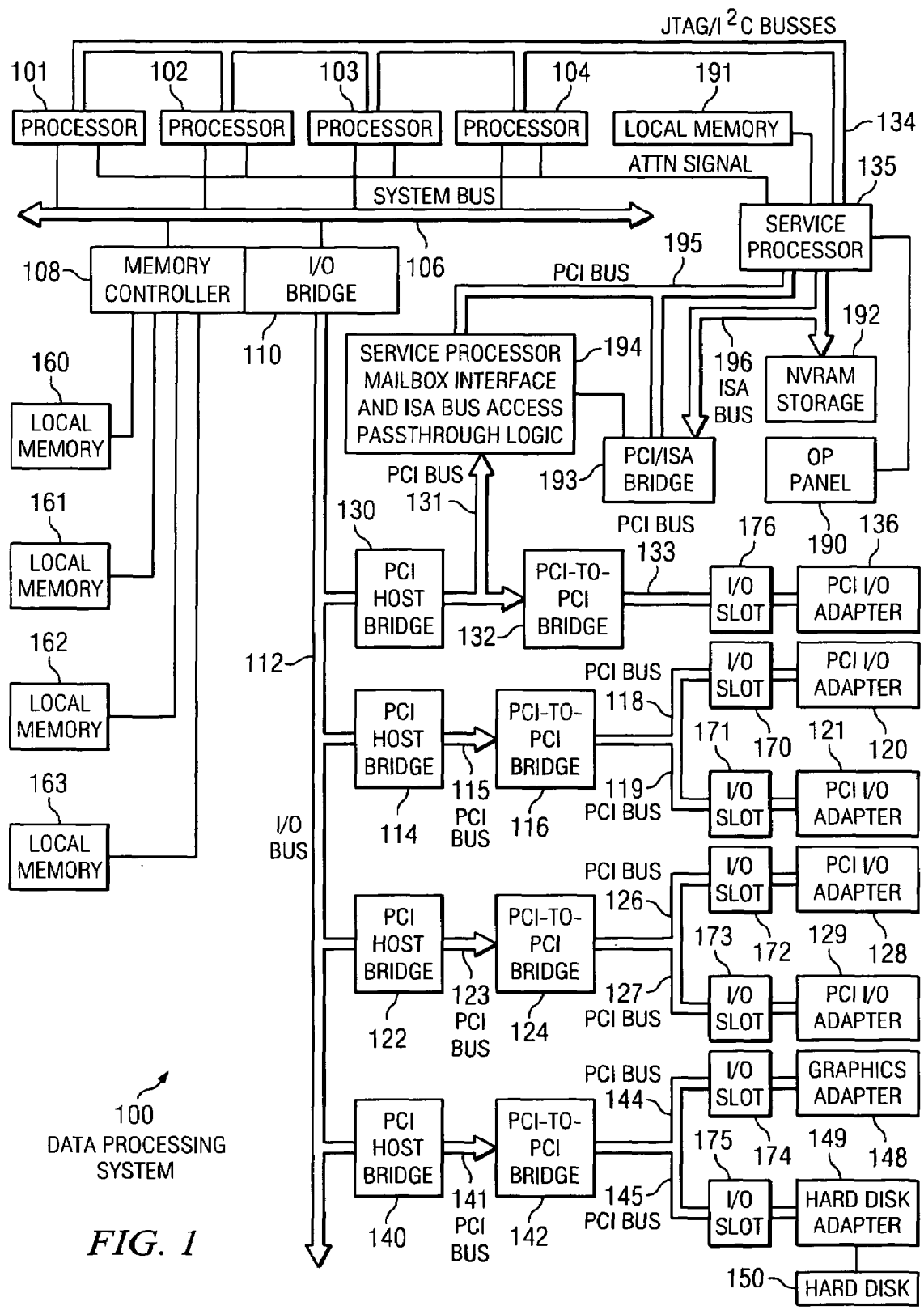
FIG. 1 is a block diagram of a data processing system in which aspects of the present invention may be implemented.

With reference now to the figures, and in particular with reference to FIG. 1, a block diagram of a data processing system in which the present invention may be implemented is depicted. Data processing system 100 may be a symmetric multiprocessor (SMP) system including a plurality of processors 101-104, which connect to system bus 106. For example, data processing system 100 may be an IBM® eServer™, a product of International Business Machines Corporation in Armonk, N.Y., implemented as a server within a network. Alternatively, a single processor system may be employed. Also connected to system bus 106 is memory controller 108, which provides an interface to a plurality of local memories 160-163. I/O bus bridge 110 connects to system bus 106 and provides an interface to I/O bus 112. Memory controller 108 and I/O bus bridge 110 may be integrated as depicted.

Data processing system 100 is a logical partitioned (LPAR) data processing system. Thus, data processing system 100 may have multiple heterogeneous operating systems (or multiple instances of a single operating system) running simultaneously. Each of these multiple operating systems may have any number of software programs executing within it. Data processing system 100 is logically partitioned such that different PCI I/O adapters 120-121, 128-129, and 136, graphics adapter 148, and hard disk adapter 149 may be assigned to different logical partitions. In this case, graphics adapter 148 connects to a display device (not shown), while hard disk adapter 149 connects to and controls hard disk 150.

Thus, for example, suppose data processing system 100 is divided into three logical partitions, P1, P2, and P3. Each of PCI I/O adapters 120-121, 128-129, 136, graphics adapter 148, hard disk adapter 149, each of processors 101-104, and memory from local memories 160-163 is assigned to each of the three partitions. In these examples, local memories 160-163 may take the form of dual in-line memory modules (DIMMs). DIMMs are not normally assigned on a per DIMM basis to partitions. Instead, a partition will get a portion of the overall memory seen by the platform. For example, processor 101, some portion of memory from local memories 160-163, and I/O adapters 120, 128, and 129 may be assigned to logical partition P1; processors 102 and 103, some portion of memory from local memories 160-163, and PCI I/O adapters 121 and 136 may be assigned to partition P2; and processor 104, some portion of memory from local memories 160-163, graphics adapter 148, and hard disk adapter 149 may be assigned to logical partition P3.

Each operating system executing within data processing system 100 is assigned to a different logical partition. Thus, each operating system executing within data processing system 100 may access only those I/O units that are within its logical partition. Thus, for example, one instance of the Advanced Interactive Executive (AIX®) operating system may be executing within partition P1, a second instance (image) of the AIX® operating system may be executing within partition P2, and a Linux® or OS/400 operating system may be operating within logical partition P3.

Peripheral component interconnect (PCI) host bridge 114 connected to I/O bus 112 provides an interface to PCI local bus 115. A number of PCI input/output adapters 120 and 121 connect to PCI bus 115 through PCI-to-PCI bridge 116, PCI bus 118, PCI bus 119, I/O slot 170, and I/O slot 171. PCI-to-PCI bridge 116 provides an interface to PCI busses 118 and 119. PCI I/O adapters 120 and 121 are placed into I/O slots 170 and 171, respectively. Typical PCI bus implementations support between four and eight I/O adapters (i.e. expansion slots for add-in connectors). Each PCI I/O adapters 120 and 121 provides an interface between data processing system 100 and input/output devices such as, for example, other network computers, which are clients to data processing system 100.

An additional PCI host bridge 122 provides an interface for an additional PCI bus 123. PCI bus 123 connects to a plurality of PCI I/O adapters 128 and 129. PCI I/O adapters 128 and 129 connect to PCI bus 123 through PCI-to-PCI bridge 124, PCI bus 126, PCI bus 127, I/O slot 172, and I/O slot 173. PCI-to-PCI bridge 124 provides an interface to PCI busses 126 and 127. PCI I/O adapters 128 and 129 are placed into I/O slots 172 and 173, respectively. In this manner, additional I/O devices, such as, for example, modems or network adapters may be supported through each of PCI I/O adapters 128 and 129. Consequently, data processing system 100 allows connections to multiple network computers.

A memory mapped graphics adapter 148 is inserted into I/O slot 174 and connects to I/O bus 112 through PCI bus 144, PCI-to-PCI bridge 142, PCI bus 141, and PCI host bridge 140. Hard disk adapter 149 may be placed into I/O slot 175, which connects to PCI bus 145. In turn, this bus connects to PCI-to-PCI bridge 142, which connects to PCI host bridge 140 by PCI bus 141.

PCI host bridge 130 provides an interface for PCI bus 131 to connect to I/O bus 112. PCI I/O adapter 136 connects to I/O slot 176, which connects to PCI-to-PCI bridge 132 by PCI bus 133. PCI-to-PCI bridge 132 connects to PCI bus 131. This PCI bus also connects PCI host bridge 130 to service processor mailbox interface and ISA bus access pass-through logic 194 and PCI-to-PCI bridge 132. Service processor mailbox interface and ISA bus access pass-through logic 194 forwards PCI accesses destined to the PCI/ISA bridge 193. NVRAM storage 192 connects to the ISA bus 196. Service processor 135 connects to service processor mailbox interface and ISA bus access pass-through logic 194 through its local PCI bus 195. Service processor 135 also connects to processors 101-104 via a plurality of JTAG/I²C busses 134. JTAG/I²C busses 134 are a combination of JTAG/scan busses (see IEEE 1149.1) and Phillips I²C busses. However, alternatively, JTAG/I²C busses 134 may be replaced by only Phillips I²C busses or only JTAG/scan busses. All SP-ATTN signals of the host processors 101-104 connect together to an interrupt input signal of service processor 135. Service processor 135 has its own local memory 191 and has access to the hardware OP panel 190.

When data processing system 100 is initially powered up, service processor 135 uses JTAG/I²C busses 134 to interrogate the system processors 101-104, memory controller 108, and I/O bridge 110. At the completion of this step, service processor 135 has an inventory and topology understanding of data processing system 100. Service processor 135 also executes Built-In-Self-Tests (BISTs), Basic Assurance Tests (BATs), and memory tests on all elements found by interrogating the host processors 101-104, memory controller 108, and I/O bridge 110. Any error information for failures detected during the BISTs, BATs, and memory tests are gathered and reported by service processor 135.

If a meaningful/valid configuration of system resources is still possible after taking out the elements found to be faulty during the BISTs, BATs, and memory tests, then data processing system 100 is allowed to proceed to load executable code into local memories 160-163. Service processor 135 then releases processors 101-104 for execution of the code loaded into local memories 160-163. While processors 101-104 are executing the code from respective operating systems within data processing system 100, service processor 135 enters a mode of monitoring and reporting errors. The type of items monitored by service processor 135 include, for example, the cooling fan speed and operation, thermal sensors, power supply regulators, and recoverable and non-recoverable errors reported by processors 101-104, local memories 160-163, and I/O bridge 110.

Service processor 135 saves and reports error information related to all the monitored items in data processing system 100. Service processor 135 also takes action based on the type of errors and defined thresholds. For example, service processor 135 may take note of excessive recoverable errors on a processor's cache memory and decide that this is predictive of a hard failure. Based on this determination, service processor 135 may mark that resource for de-configuration during the current running session and future Initial Program Loads (IPLs). IPLs are also sometimes referred to as a "boot" or a "bootstrap".

Data processing system 100 may be implemented using various commercially available computer systems. For example, data processing system 100 may be implemented using IBM® eServer™ iSeries Model 840 system available from International Business Machines Corporation. Such system may support logical partitioning using an OS/400® operating system, which is also available from International Business Machines Corporation.

Those of ordinary skill in the art will appreciate that the hardware depicted in FIG. 1 may vary. For example, other peripheral devices, such as optical disk drives and the like, also may be used in addition to or in place of the hardware depicted. The depicted example is not meant to imply architectural limitations with respect to the present invention.

Figure 2:
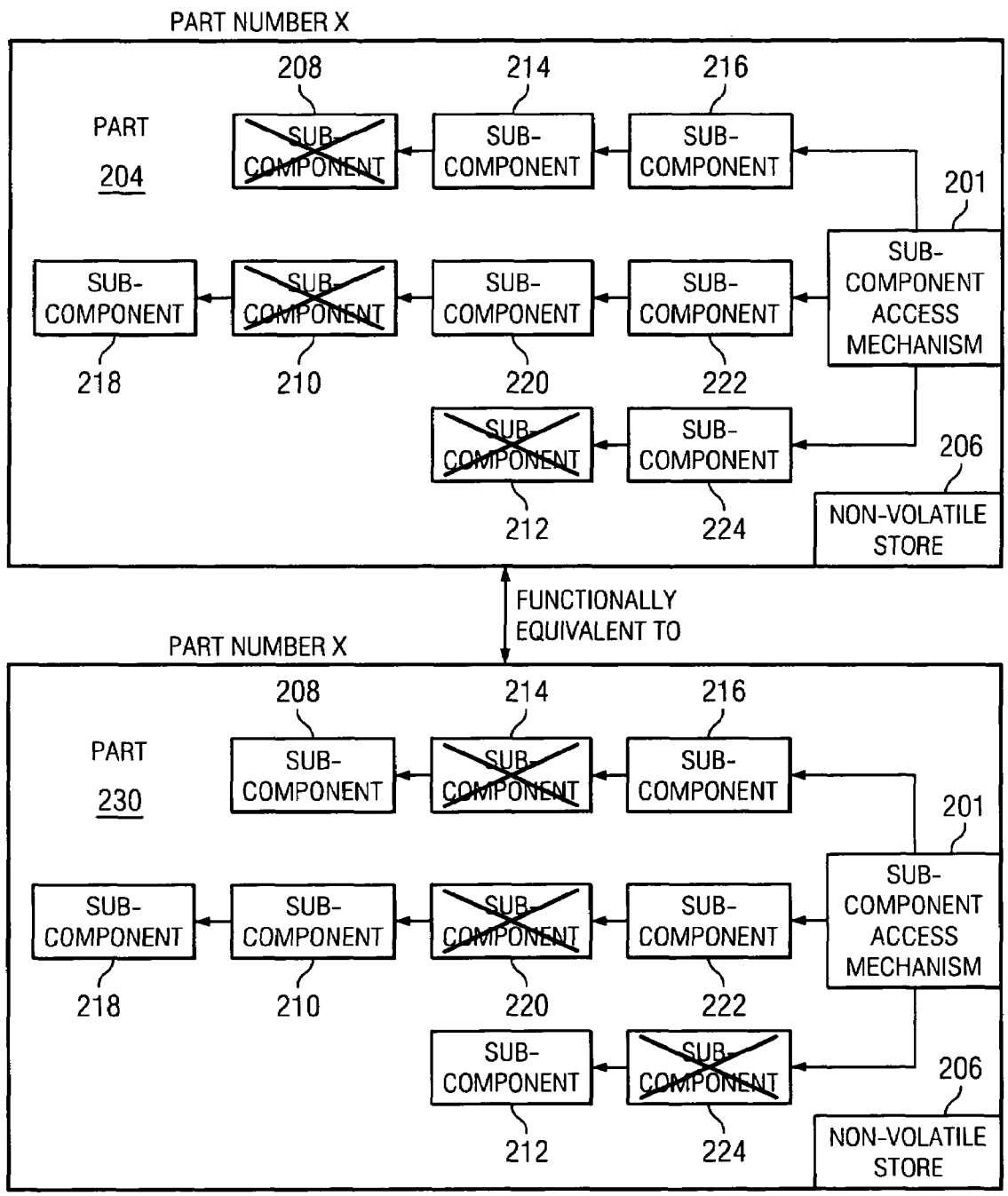
FIG. 2 is a diagram illustrating two functionally equivalent parts with multiple replicated sub-components that are partially defective is depicted in accordance with an illustrative embodiment of the present invention.

Turning now to FIG. 2, a diagram illustrating two functionally equivalent parts with multiple replicated sub-components that are partially defective is depicted in accordance with an illustrative embodiment of the present invention. As shown in FIG. 2, parts 204 and 230 consist of multiple replicated sub-components, sub-component access mechanism 201, and non-volatile store 206. Replicated sub-components are functionally equivalent sub-components that are replicated on the same part. In this example, there are three sets of replicated sub-components: sub-components 208, 214, and 216; sub-components 218, 210, 220, and 222; and sub-components 212 and 224. Sub-component access mechanism 201 is a mechanism used by a test facility to access operational information from sub-components 208-212. An example of sub-component access mechanism is JTAG/I²C busses 134 in FIG. 1.

Part 204 can tolerate absences of some instances of the replicated sub-components, in one example, an absence of sub-components 208-212. Similarly, part 230 can tolerate absences of replicated sub-components 214, 220, and 224. During the configuration process of parts 204 and 230, a configuration agent, configures parts 204 and 230, via sub-component access mechanism 201, in such a way that only functional sub-components are used.

In this illustrative embodiment, the configuration agent is implemented on a service processor. However, the configuration agent may be implemented in other components, such as within the processor chip itself. In addition, as long as the number of replicated sub-components per set remains the same, these parts are functionally equivalent. In the example of FIG. 1, parts 204 and 230 are functionally equivalent, because the number of replicated sub-components that are functional remains the same.

Currently, each combination of operational and non-operational sub-components on a part is assigned a unique part number. In this example, the combination with the absence of sub-components 208-212 in part 204 would have been assigned part number X, while the combination with the absence of sub-components 214, 220, and 224 in part 230 would have been assigned a part number Y. However, as the number of replicated sub-components increases in parts 204 and 230, the number of part numbers also increases. The high number of part numbers causes additional overhead. With the present invention, a single part number X may be assigned to both parts, parts 204 and 230, since information regarding non-operational sub-components may be stored in non-volatile storage 206. In addition, parts 204 and 230 may be configured in a way that is transparent to the customer as to what actual sub-components are functional. Parts 204 and 230 can be used interchangeably in a system without changing the functional characteristics of that system.

Figure 3:
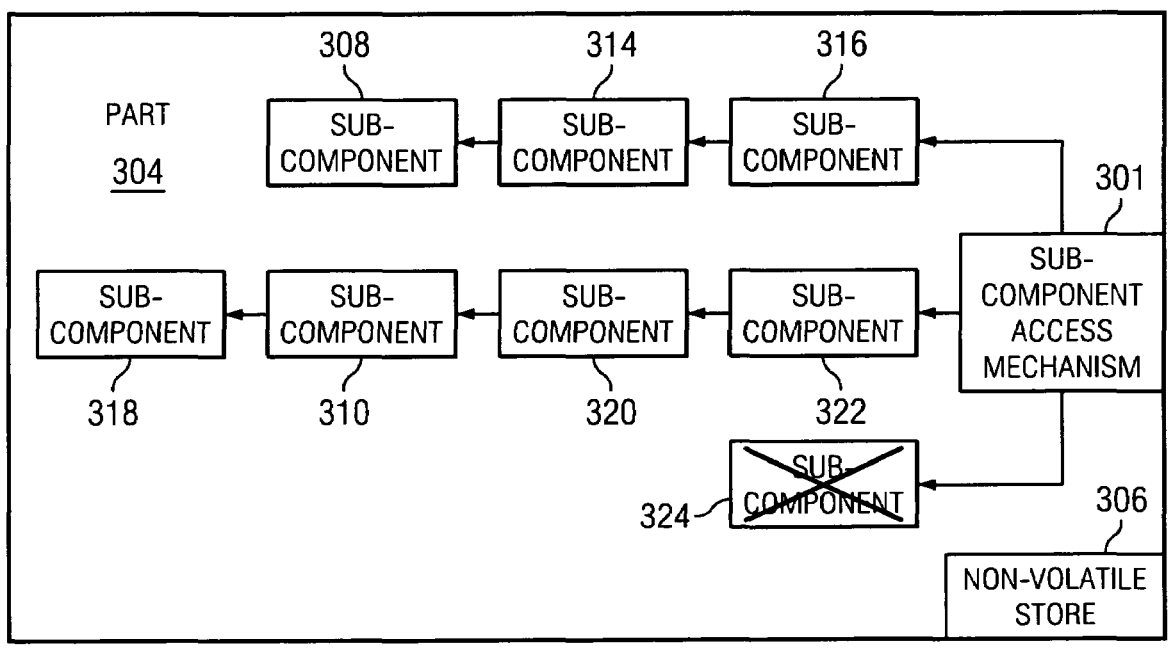
FIG. 3 is a diagram illustrating a functional reduced part in accordance with an illustrative embodiment of the present invention.

Turning now to FIG. 3, a diagram illustrating a functional reduced part is depicted in accordance with an illustrative embodiment of the present invention. As shown in FIG. 3, part 304 is similar to parts 204 and 230 in FIG. 2, which includes non-volatile store 306, sub-component access mechanism 301, and subcomponents 308-324, except that it contains a non-replicated subcomponent 324. In this scenario, non-replicated subcomponent 324 is not vital for the overall function of part 304. An example of a non-replicated sub-component is a special hardware assist engine, such as a floating-point unit, which is not always used by a user of the system. However, even with the absence of non-replicated sub-component 324, part 304 can still be used as a functional reduced part, instead of being scrapped.

Aspects of the present invention provide a computer implemented method, a data processing system, and a computer program product for automatically identifying multiple combinations of operational and non-operational components on integrated circuit chips with a single part number. The aspects of the present invention enable information of non-operational sub-components of a part to be stored within the part itself. In the context of the present invention, a part may be a single chip module or a multi-chip module.

By storing non-operational sub-component information on the part itself, information of non-operational sub-components may persist across power on/off cycles and may travel with the part as the part is moved from the manufacturing process to the customer or between different systems. In this way, partial-good parts may still be marketed and/or deployed to the customer or into different systems in a transparent manner.

These subcomponents may all be of the same type or different types depending on the application of the aspects of the present invention. For example, subcomponents may be at least one of a processor core, a cache slice, a cache directory structure, one or more external interfaces. In other words the subcomponents may all be of the same type, such as a cache slice or may also include processor cores. The external interfaces access may be at least one of input/output devices, memory, co-processors, and processors.

With the ability to store information of non-operational sub-components in the part itself, de-allocation scheme may be implemented across power on/off cycles to mark non-operational sub-components defective. Marking non-operational sub-components defective across power on/off cycles help to prevent usage of these faulty sub-components in future testing, manufacturing processes, or systems of customers. Alternatively, operational sub-components may also be marked.

In addition, the ability to store information of non-operational sub-components in the part itself eliminates external databases or sophisticated hardware steps that are previously required. An example of sophisticated hardware step is blowing fuses. More details regarding hardware steps for blowing fuses are discussed in U.S. Pat. No. 6,550,020B1, entitled "METHOD AND SYSTEM FOR DYNAMICALLY CONFIGURING A CENTRAL PROCESSING UNIT WITH MULTIPLE PROCESSING CORES", by Floyd et al., which is herein incorporated by reference.

Furthermore, the ability to store information of non-operational sub-components in the part itself also eliminates the need for separate transfers of information about defective sub-components to the new system or assembly. This minimizes errors that may arise with the transfers and eliminates the need for additional infrastructure for handling the transferred information. Moreover, parts with different combinations of non-operational sub-components that have the same aggregate function may now use the same part number, and thus, reduces logistics costs associated with the high number of part numbers and field stocking requirements.

In an illustrative embodiment, the aspects of the present invention package a persistency device within a part during manufacturing of the part. An example of a persistency device is serial electrically erasable and programmable read-only memory (SEEPROM). However, other persistency devices may also be used without departing the spirit and the scope of the present invention. Throughout the manufacturing process, all information regarding defective sub-components of the part are gathered and stored directly in the persistency device. This information is known as partial-good data. With a persistency device, different combinations of operational and non-operational sub-components may be tracked under a single part number.

In an illustrative embodiment, the persistency device is packaged as part of a field replacement unit (FRU), such that the device may travel with the part. A FRU is recognized in the manufacturing, order, and service process as a single part and is assigned a unique part number. When the part is plugged into a system either during manufacturing, a field upgrade, or a repair operation, the information of the defective sub-components is also accessible by the system. Examples of sub-components that may be marked defective by the aspects of the present invention include processor cores, cache slices, cache directory structures, I/O bus interfaces, fabric interfaces, memory interfaces, and co-processors.

During hardware initialization, the firmware of the system may retrieve the partial-good data from the persistency device and determine from the partial-good data which sub-components of the part are operational in order to avoid using the defective sub-components when the system is configured. During the initial power up process as described above, the hardware initialization process takes partial-good information from the non-volatile store into account and only configures and tests the available sub-components. The inventory and topology understanding of the service processor also takes this information into account.

Figure 4A:
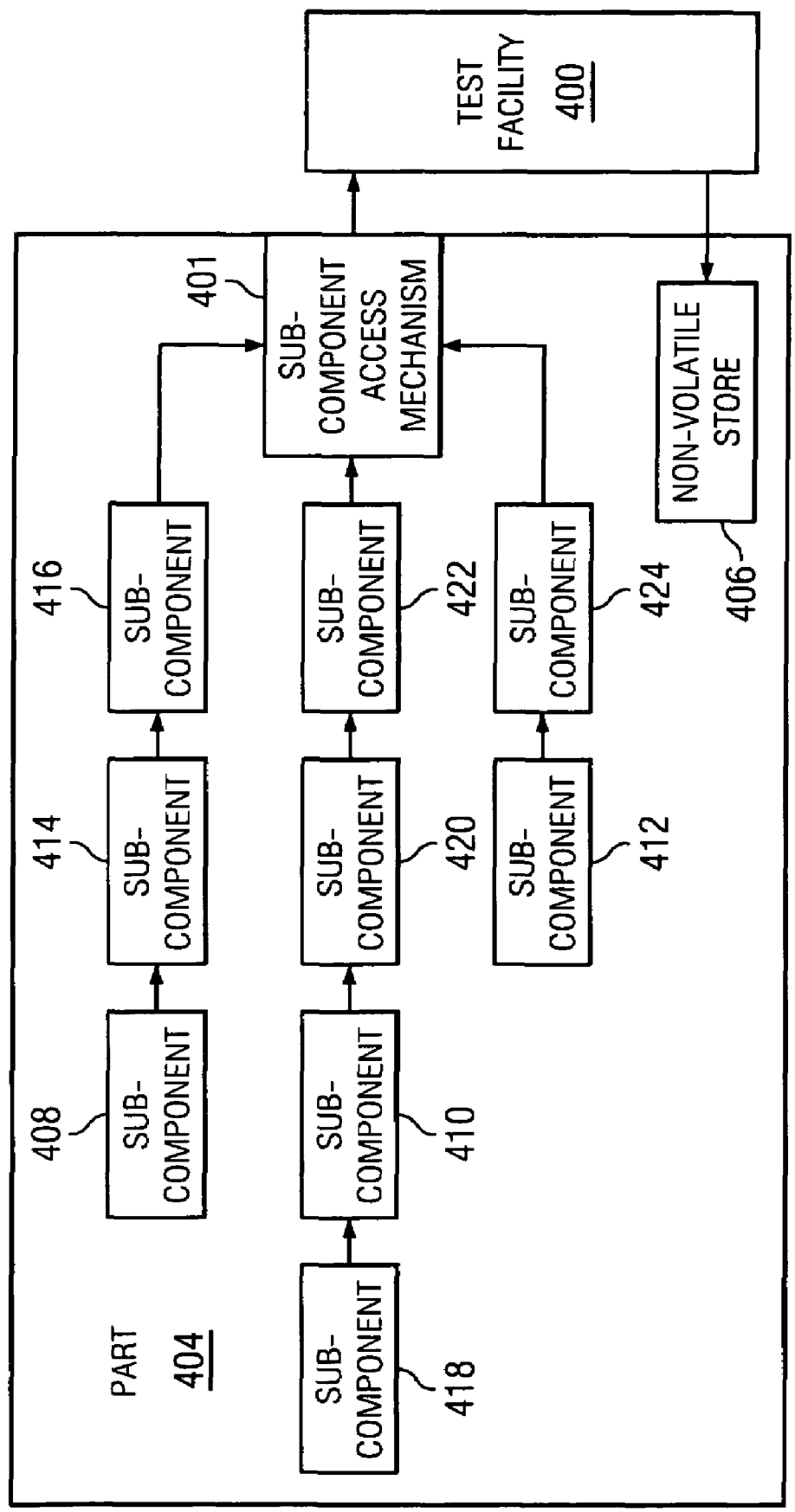
FIG. 4A is a diagram illustrating interactions between components of the present invention during a configuration determination phase in accordance with an illustrative embodiment of the present invention.

During manufacturing testing or in the field, the aspects of the present invention first determine the configuration of a part. This phase is known as configuration determination phase. Turning now to FIG. 4A, a diagram illustrating interactions between components of the present invention during a configuration determination phase is depicted in accordance with an illustrative embodiment of the present invention.

As shown in FIG. 4A, during the configuration determination phase, test facility 400 first runs a series of tests on sub-components 408-424 of part 404. Test facility 400 may be a manufacturing test, or a service processor that is currently running diagnostics, for example service processor 135 in FIG. 1. Part 404 is external to test facility 400. An example of part 404 is a single-module chip and a multi-module chip and examples of sub-components 408-424 include processor cores, cache slices, and fabric interfaces.

Test facility 400 may execute a variety of test cases. These test cases may include Built-In-Self-Tests (BISTs), which is a set of setup tests that detect signature failures, on all sub-components that are found by interrogating subcomponents 408-424 via sub-component access mechanism 401. Any error information for failures detected during the BISTs are gathered and reported by test facility 400. After the series of tests are run, test facility 400 determines which of sub-components are non-operational based on the test results and marks those sub-components as defective. Marking a sub-component defective or unavailable means recording in an internal data structure within the persistency device which of the sub-components is defective or unavailable. In this example, sub-components 408, 420, and 422 are marked defective. Alternatively, an operational sub-component may also be marked.

Test facility 400 then stores the information of the defective or non-operational components into non-volatile storage 406, which is implemented on part 404. An example of non-volatile store 406 is serial electrically erasable and programmable read-only memory (SEEPROM). The information of the defective or non-operational components is known as partial-good data.

Figure 4B:
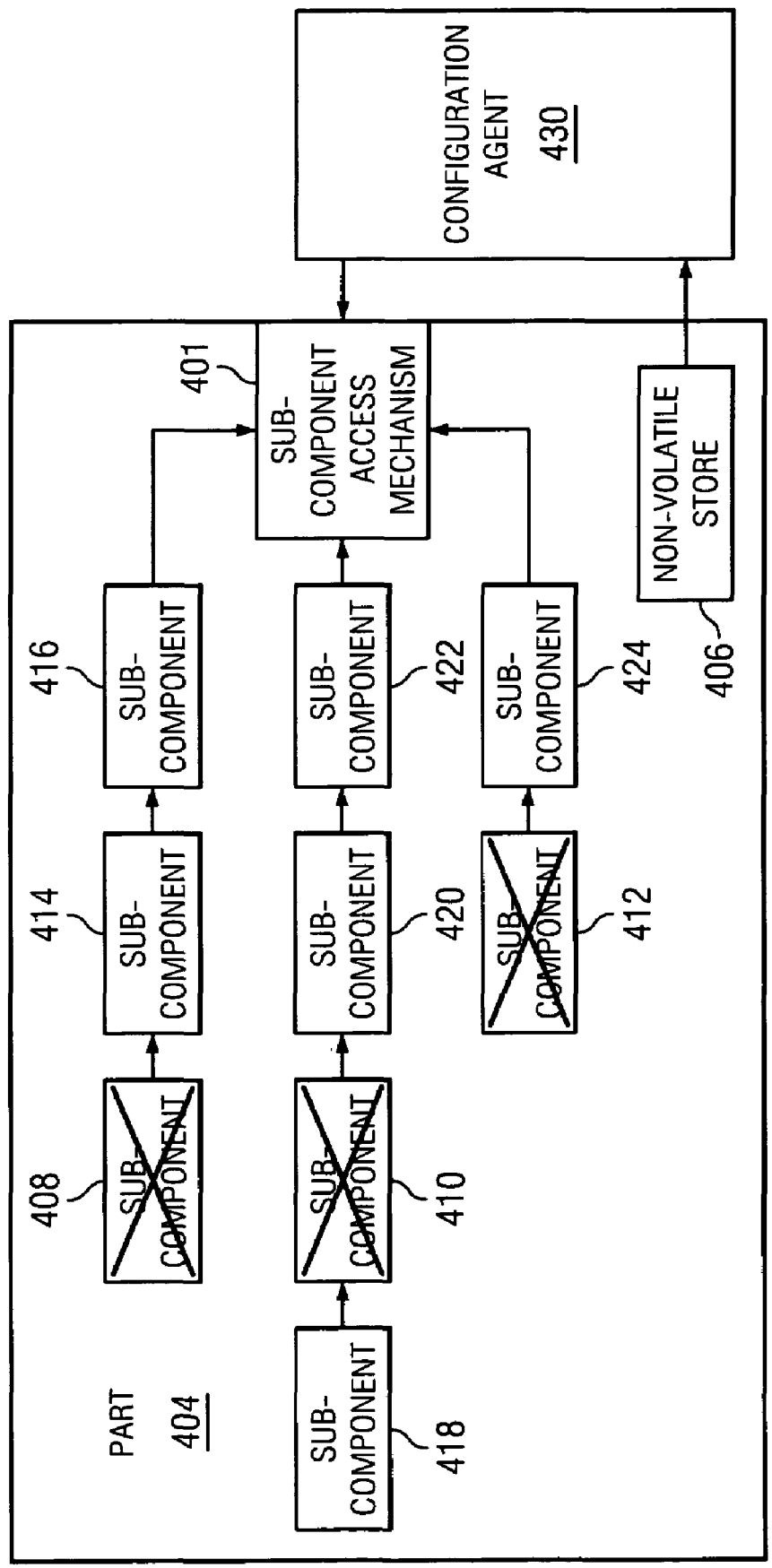
FIG. 4B is a diagram illustrating interactions between components of the present invention during a deployment phase in accordance with an illustrative embodiment of the present invention.

In order for part 404 to be functional, hardware initialization is required. Hardware initialization is a series of steps performed to place the part into a defined and initial state that allows the part to work in a computer system. In typical IBM® server environments, such as IBM® eServer™ iSeries Model 840 system, the hardware initialization steps are performed by the service Processor, such as service processor 135 in FIG. 1, using JTAG or I2C busses, such as JTAG/I²C busses 134 in FIG. 1. However, hardware initialization may also be performed by the part itself without a service processor's help. In that case, the hardware state-machines implemented directly in the part itself drives the required hardware initialization steps During hardware initialization, the aspects of the present invention enter a second phase known as part deployment phase. Turning now to FIG. 4B, a diagram illustrating interactions between components of the present invention during a deployment phase is depicted in accordance with an illustrative embodiment of the present invention.

As shown in FIG. 4B, configuration agent 430 reads partial-good data, which contains information of the non-operational components, from non-volatile storage 406. Configuration agent 430 may also be implemented as an application running on a service processor, such as service processor 135 in data processing system 100 in FIG. 1. Configuration agent 430 may perform this step during initial startup of part 404 or later on, for example, in the event of a hot plug scenario, when the part 404 is brought online in a currently running system.

Next, based on the partial-good data retrieved from non-volatile storage 406, configuration agent 430 determines hardware initialization settings for the sub-components that are still operational. In this example, sub-components 414-

424 are still operational. Also, based on the partial-good data retrieved from non-volatile storage 406, configuration agent 430 de-configures defective or non-operational sub-components 408, 410, and 412.

Figure 5A:
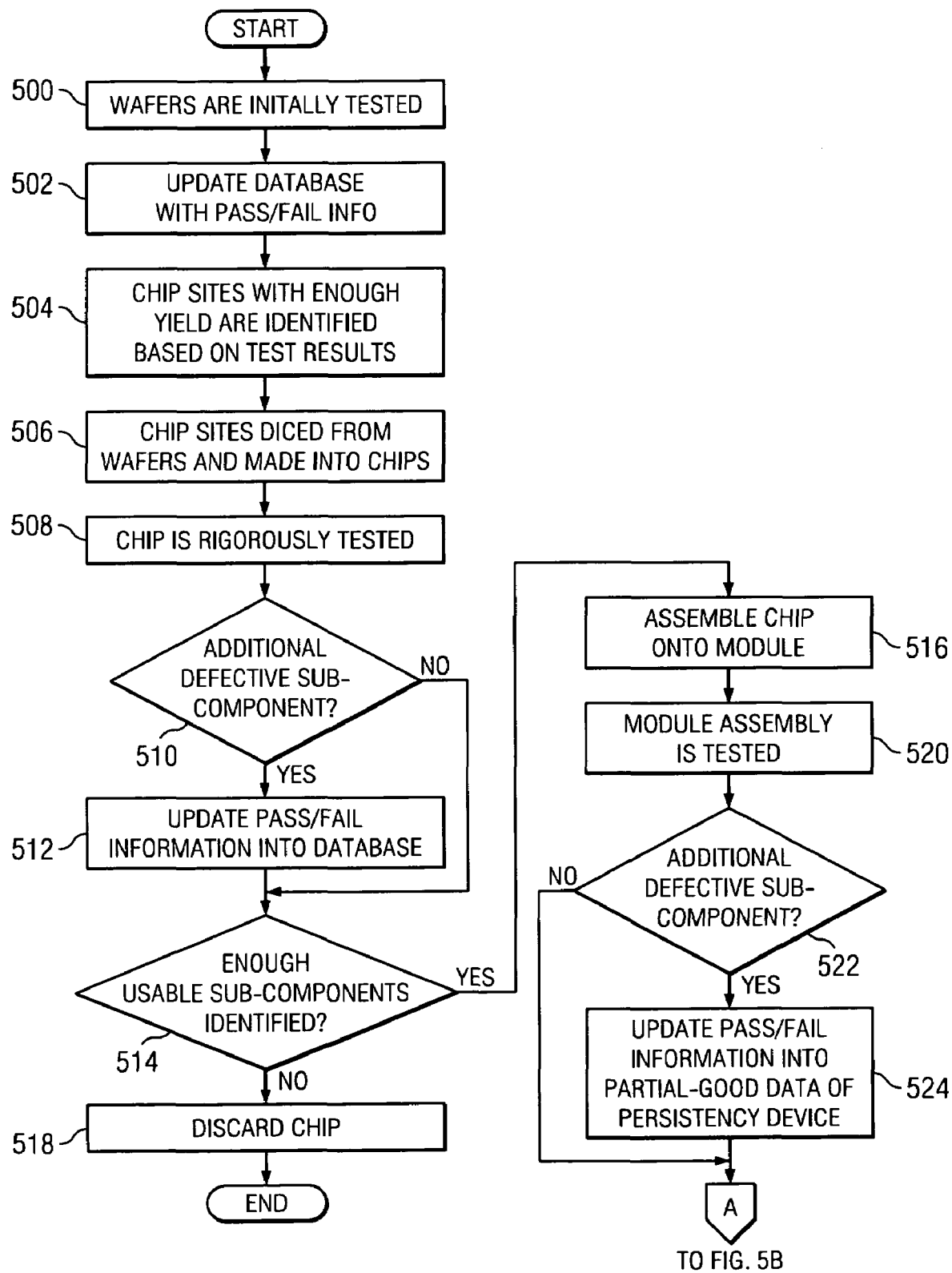
FIGS. 5A and 5B are flowcharts of a manufacturing process in which aspects of the present invention may be implemented in accordance with an illustrative embodiment of the present invention.
Figure 5B:
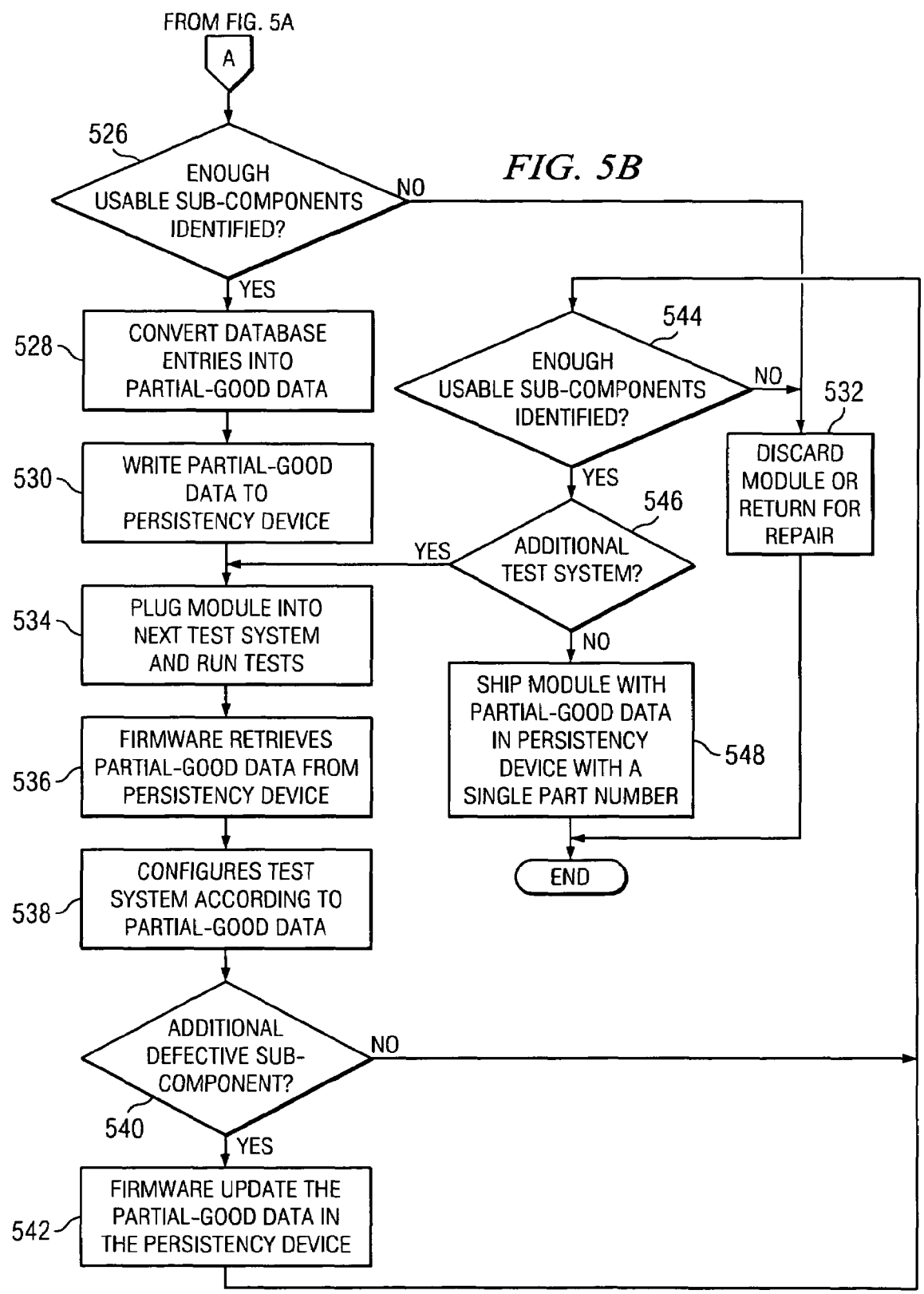

Turning now to FIGS. 5A and 5B, flowcharts of a manufacturing process in which aspects of the present invention may be implemented is depicted in accordance with an illustrative embodiment of the present invention. This process describes one possible implementation of the aspects of the present invention in a manufacturing process. As shown in FIG. 5A, the process begins when wafers containing chip sites are initially tested (step 500). Each sub-component of each chip site is tested and the pass/fail information of each test is logged into a database (step 502). The pass/fail information is logged along with origin information of the chip sites, for example, a lot number, a wafer identifier, and a chip site on the wafer.

Next, based on the pass/fail information, chip sites that yield enough potentially usable sub-components are automatically identified (step 504). These chip sites are diced from the wafers and made into chips (step 506). At this time, sophisticated hardware steps, such as blowing fuses with the origin information inside the chip, are preformed.

Once the chips are made, the chips are then rigorously tested (step 508) and a determination is made by the testing facility as to whether additional sub-components are defective (step 510). If additional defective sub-components are found, the database is updated with pass/fail information for each test of each sub-component of each chip (step 512). If no additional defective sub-components are found, the process continues to step 514.

At step 514, a determination is then made by the test facility as to whether enough usable sub-components are identified on the chip. If enough usable sub-components are identified, the chip is assembled onto a module with a persistency device (step 516). An example of a persistency device is SEEPROM. If not enough usable sub-components are identified, the chip is discarded (step 518) and the process terminates thereafter. Thus, the module may include one or more partial-good chips that contain operational and non-operational sub-components.

The module assembly or FRU is again tested at the assembly level (step 520). A determination is again made by the testing facility as to whether additional sub-components are defective (step 522). If additional defective sub-components are found, the partial-good data on the persistency device is updated with pass/fail information for each test of each sub-component of each chip on the module (step 524). If no additional defective sub-components are found, the process continues to step 526 in FIG. 5B.

As shown in FIG. 5B, at step 526, a determination is again made by the test facility as to whether enough usable sub-components are identified on the module. If enough usable sub-components are identified, the database entries for all the chips on the module are converted into partial-good data for sub-components on each chip (step 528). In turn, the partial-good data is written to a persistency device (step 530), such as a SEEPROM. However, at step 526, if not enough usable sub-components are identified, the module is discarded or returned to the assembly line to be repaired (step 532) and the process terminates thereafter.

The module is then plugged into the next test system in a series of test systems and run additional rigorous regression tests (step 534). The firmware retrieves partial-good data from the persistency device (step 536) and configures the test system according to the partial-good data (step 538). More details regarding how the firmware retrieves partial-good data from the persistency device and exploits the partial-good data to configure the test system is discussed in FIG. 6. A determination is again made by the firmware as to whether additional sub-components are defective (step 540). If additional defective sub-components are found, the firmware updates the partial-good data in the persistency device (step 542). If no additional defective sub-components are found, the process continues to step 544.

At step 544, a determination is again made by the firmware as to whether enough usable sub-components are identified on the module. If not enough usable sub-components are identified, the process returns to step 532, where the module is discarded or returned to repair. But if enough usable sub-components are identified, determination is made as to whether additional test systems are present (step 546). If additional test systems are present, the process returns to step 534 to plug the module into the next test system. Otherwise, the module is ready to be shipped, either as field stock, field upgrade, or in a new machine, with partial-good data in the persistency device and with a single part number (step 548). Thus, the process terminates thereafter.

Figure 6:
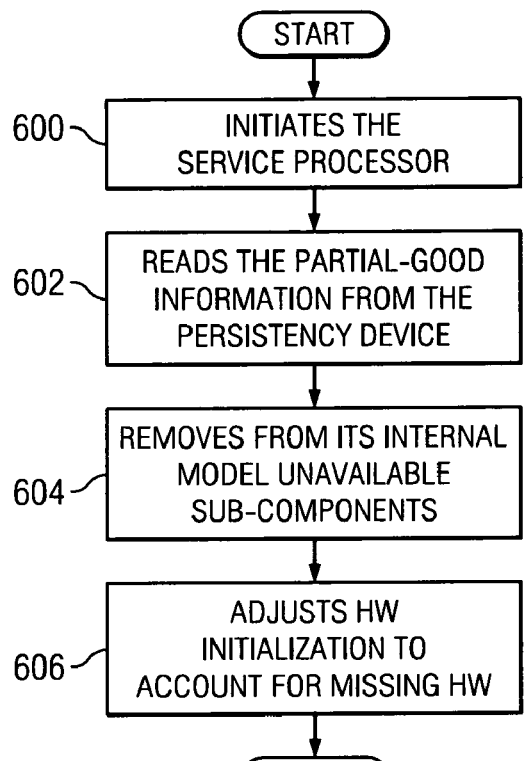
FIG. 6 is a flowchart of a process for exploitation partial-good data to configure the test system in accordance with an illustrative embodiment of the present invention.

Turning now to FIG. 6, a flowchart of a process for exploitation partial-good data to configure the test system is depicted in accordance with an illustrative embodiment of the present invention. This process may be implemented by firmware within a service processor, such as service processor 135 in FIG. 1. This process also describes steps 536 and 538 in FIG. 5 in further detail. As shown in FIG. 6, from the perspective of the firmware, the process begins when the service processor is initiated (step 600). At this time, the configuration agent is also started. The firmware on the service processor has knowledge of the maximum possible system hardware configuration. One way the firmware acquires this knowledge is through reading the part number and using it to access the table of system hardware configurations stored in the service process firmware. The firmware then reads the partial-good information from the persistency device (step 602) and removes from its internal model of the maximum hardware configuration those sub-components that are marked un-available (step 604).

In addition, the firmware adjusts the hardware initialization to account for the missing hardware (step 606) with the process terminating thereafter. This adjustment includes reassigning sub-components to work with different hardware. For example, if a processor core is marked unavailable, a cache that is normally used by that processor core may be reassigned to a different processor core on the same chip. Thus, the process terminates thereafter. The part is then initialized and configured appropriately using the hardware access mechanism, for example, JTAG/I$^2$C busses 134 in FIG. 1.

As discussed above, the ability to store the information of defective sub-components on the part itself minimizes the number of part numbers and thus reduces logistics costs. In addition, other use cases of the aspects of the present invention help simplify operations. One such operation is concurrent upgrade on demand (CuOD) operation. CuOD is a feature where a company that manufactures and sells the system in which the part resides initially enables only a portion of available computing resources on a part for use, but the company may enable additional resources that are hidden on demand.

Figure 7:
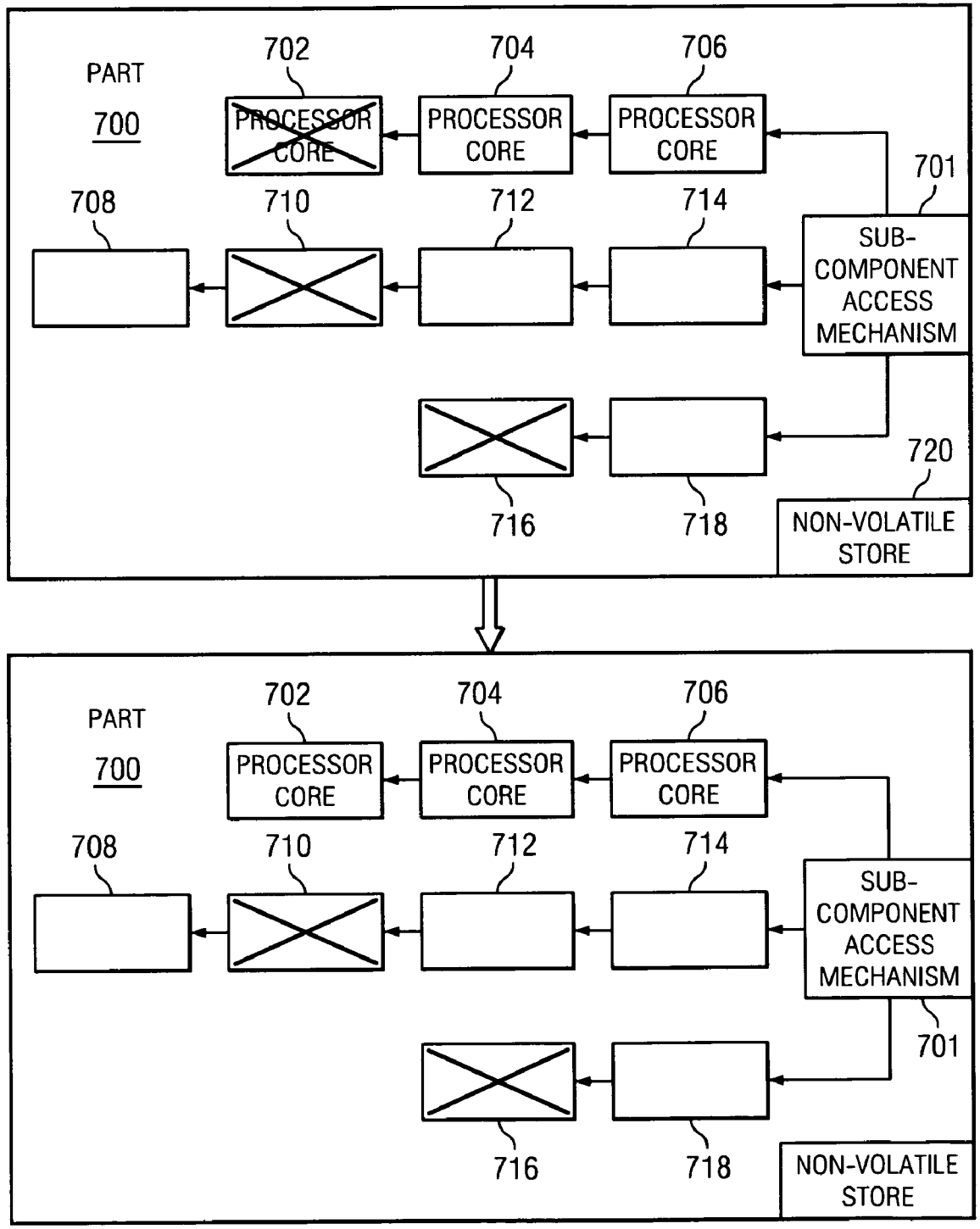
FIG. 7 is a diagram illustrating a concurrent upgrade on demand (CuOD) use case enabled by the aspects of the present invention in accordance with an illustrative embodiment of the present invention.

Turning now to FIG. 7, a diagram illustrating a concurrent upgrade on demand (CuOD) use case enabled by the aspects of the present invention is depicted in accordance with an illustrative embodiment of the present invention. As shown in FIG. 7, part 700 consists of sub-components 702-718. The firmware of a system can write securely to non-volatile store 720 information about operational and non-operational sub-components.

Initially, the customer licenses only sub-components 704, 706, 708, 712, 714, and 718. Thus, only those sub-components are configured by the system. Sub-components that are unlicensed, in this example, sub-components 702, 710, and 716, are marked unavailable in non-volatile store 720. Thus, the aspects of the present invention offer customers fine granularity of options or features with regard their system configuration.

Later, when the customer acquires usage of additional sub-components, the newly acquired sub-components are marked available by the firmware in non-volatile store 720. In this example, sub-component 702 is marked available in non-volatile store 720 and may be brought on line by the configuration agent.

One exemplary usage of CuOD use case is to acquire new processor core for a system. For example, part 700 only includes two processor cores, processor cores 704 and 706. By acquiring new processor core 702, the throughput of the overall system is dynamically increased. There is no longer a need for the firmware to have knowledge of what sub-component is allowed and not allowed, because all the information of what sub-component is acquired and not acquired is stored in non-volatile store 720. In addition, with the ability to read/write information directly to non-volatile store 720, the need for multitude of part numbers to reflect different system configurations is also eliminated.

In addition to CuOD, another use case that the aspects of the present invention help in simplifying operations is processor run-time de-configuration, which is also known as GARD. Similar to the CuOD use case, a large amount of software is currently in place in the firmware to support de-configuration of broken hardware components that are defective in the field. The firmware currently stores all de-configuration information within a non-volatile RAM area of the service processor, also referred to as NVRAM. The ability to store partial-good information in a non-volatile store may be extended to additionally store field de-configuration information. A generic de-configuration firmware may be used to handle defective sub-components in a similar manner.

Figure 8:
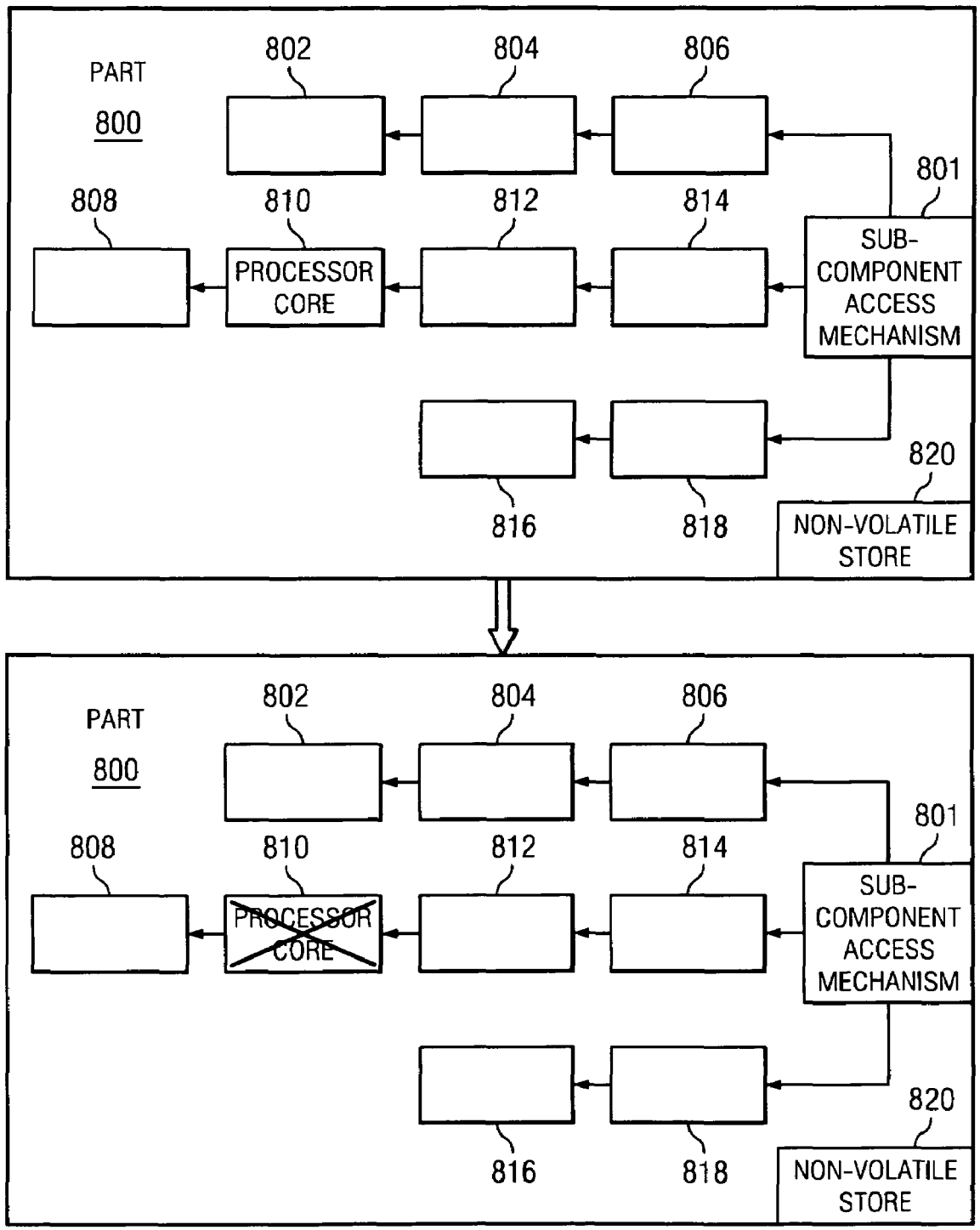
FIG. 8 is a diagram illustrating a processor run-time de-configuration (GARD) use case enabled by the aspects of the present invention in accordance with an illustrative embodiment of the present invention.

Turning now to FIG. 8, a diagram illustrating a processor run-time de-configuration (GARD) use case enabled by the aspects of the present invention is depicted in accordance with an illustrative embodiment of the present invention. As shown in FIG. 8, part 800 consists of sub-components 802-818.

Either during hardware initialization or at run-time, a sub-component is detected as defective. For example, processor core 810 is detected as defective. In turn, processor core 810 is de-configured by the firmware and is marked non-available in non-volatile store 820, where the de-configuration information is stored.

In the next hardware initialization of the system, the firmware may read the de-configuration information from non-volatile store 820 prior to configuring sub-components 802-818 of part 800. In this way, no redetection of defective sub-components is necessary, since all the information of defective sub-components is known ahead of time. Thus, by storing de-configuration information in the non-volatile store, dependencies on NVRAM and the amount of firmware support that is needed from the GARD component are reduced.

Turning now to FIGS. 9A-9C, flowcharts of processes for a concurrent update on demand (CuOD) use case enabled by aspects of the present invention are depicted in accordance with an illustrative embodiment of the present invention. FIG. 9A illustrates the process during system boot. As shown in FIG. 9A, from the perspective of the service processor, the process begins when the service processor is initiated (step 900). Next, the firmware in the service processor reads partial-good data from the persistency device that is on the part (step 902) and the firmware removes from its internal model sub-components that are unavailable (step 904).

The firmware then reads the persistency device to determine the number of already licensed sub-components (step 906). In this illustrative example, there are two types of data stored in the persistency device: partial-good data indicating operational and non-operational sub-components within the part and concurrent update on demand data indicating the number of licensed and unlicensed sub-components.

After the number of licensed sub-components is determined, the firmware initializes the hardware and only a maximum number of licensed sub-components (step 908). The remaining sub-components are not available to the user (step 910). Thus, the system boot process terminates thereafter.

FIG. 9B illustrates the process when customer licenses a sub-component. As shown in FIG. 9B, from the perspective of the service processor, the process begins when the firmware of the service processor detects that a customer licenses a new sub-component (step 912). Next, the firmware updates the information in the persistency device to mark the previously unavailable sub-component to available (step 914) and the firmware proceeds to initialize, configure, and bring online the previously unavailable sub-component (step 916). Thus, the process terminates thereafter.

FIG. 9C illustrates the process when a sub-component is unlicensed by a customer. As shown in FIG. 9C, from the perspective of the service processor, the process begins when the firmware of the service processor detects a return of licensed sub-component from the customer (step 920).

Next, the firmware updates the information in the persistency device to mark the available sub-component to unavailable (step 922). Subsequently, the firmware removes the available sub-component from the hardware configuration (step 924) and the un-licensed sub-component is now unavailable to the user (step 926). Thus, the process terminates thereafter.

Figure 10:
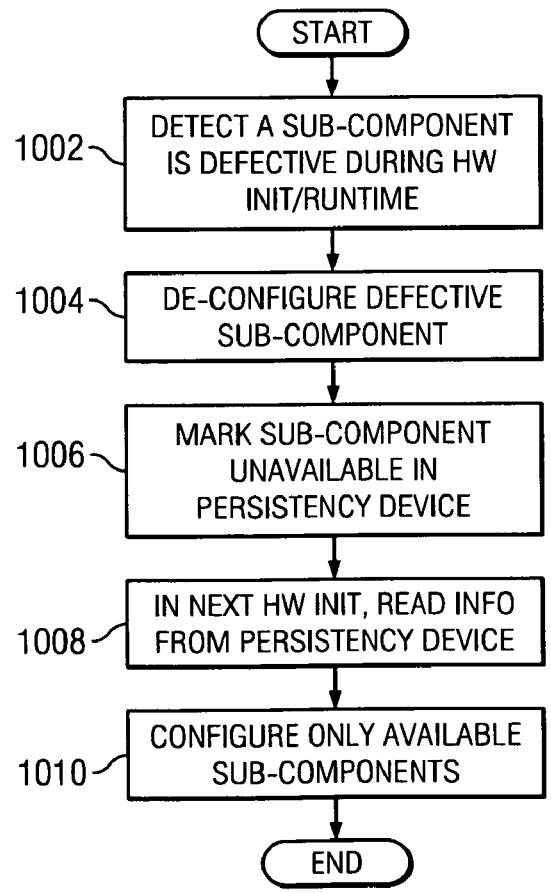
FIG. 10 is a flowchart of a process for a processor run-time de-configuration (GARD) use case enabled by aspects of the present invention in accordance with an illustrative embodiment of the present invention.

Turning now to FIG. 10, a flowchart of a process for a processor run-time de-configuration (GARD) use case enabled by aspects of the present invention is depicted in accordance with an illustrative embodiment of the present invention. As shown in FIG. 10, from the perspective of the service processor, the firmware detects that a sub-component is defective either during hardware initialization or runtime (step 1002).

Next, the firmware de-configures the defective sub-component (step 1004) and marks the sub-component unavailable in the persistency device (step 1006). In the next hardware initialization, the firmware reads the information directly from the persistency device (step 1008) prior to configuring the sub-components and configures only the available sub-components (step 1010). Thus, the process terminates thereafter.

In summary, the aspects of the present invention enable storage of information of defective sub-components within the part itself. The information is persisted across power on/off cycles and as the part is moved from manufacturing to the customer or between systems. With the aspects of the present invention, usable yields of the multiple sub-component parts may be increased, and thus, reduces scrapping and reworking costs and enables high volume part shipments.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for automatically identifying components, the computer implemented method comprising:
    providing a non-volatile storage device on an integrated circuit chip, wherein the integrated circuit chip includes a plurality of replicated sub-components that are partially defective, and wherein the integrated circuit chip is functionally equivalent to another integrated circuit chip with an equal number of replicated sub-components as long as a number of available sub-components of a type on the integrated circuit chip and the another integrated circuit chip are equal;
    identifying a set of available sub-components and a set of unavailable sub-components in the plurality of replicated sub-components based on a series of testing;
    storing information about the set of available sub-components and the set of unavailable sub-components within the non-volatile storage device on the integrated circuit chip;
    reading the information from the non-volatile storage device on the integrated circuit chip;
    configuring available sub-components based on the information read from the non-volatile storage device on the integrated circuit chip, wherein the configuring is performed by a configuration agent implemented within the integrated circuit chip; and
    de-configuring unavailable sub-components based on the information read from the non-volatile storage device on the integrated circuit chip, wherein the de-configuring is performed by the configuration agent implemented within the integrated circuit chip.

2. The computer implemented method of claim 1, wherein the plurality of replicated sub-components comprise at least one of a processor core, a cache slice, a cache directory structure, and one or more external interfaces, and wherein the one or more external interfaces access at least one of input/output devices, memory, co-processors, and processors.

3. The computer implemented method of claim 1, wherein the non-volatile storage device on the integrated circuit chip is a serial electrically erasable and programmable read-only memory (SEEPROM).

4. The computer implemented method of claim 1, wherein the integrated circuit chip and the another integrated circuit chip are assigned a same part number so that different combinations of available and unavailable sub-components having a same aggregate function on the integrated circuit chip and the another integrated circuit chip are tracked under the same part number, and wherein the series of testing is performed by one of a manufacturing tester or a service processor.

5. The computer implemented method of claim 1, further comprising:
    responsive to detecting that an unavailable sub-component in the plurality of replicated sub-components becomes available, marking the unavailable sub-component as an available sub-component in the non-volatile storage device on the integrated circuit chip; and
    configuring the available sub-component.

6. The computer implemented method of claim 1, further comprising:
    responsive to detecting that an available sub-component in the plurality of replicated sub-components becomes unavailable, marking the available sub-component as an unavailable sub-component in the non-volatile storage device on the integrated circuit chip; and
    de-configuring the unavailable sub-component.

7. The computer implemented method of claim 1, further comprising:
    storing concurrent update on demand data indicating a number of licensed and unlicensed sub-components in the plurality of replicated sub-components within the non-volatile storage device on the integrated circuit chip;
    reading the concurrent update on demand data from the non-volatile storage device on the integrated circuit chip to determine the number of licensed sub-component; and
    initializing hardware to configure only a maximum number of licensed sub-components, wherein remaining sub-components are not available to a user.

8. A data processing system for automatically identifying components, the data processing system comprising:
    a bus,
    a storage device connected to the bus, wherein the storage device contains computer usable code;
    a communications unit connected to the bus; and
    a processing unit connected to the bus, wherein the processing unit executes the computer usable code to provide a non-volatile storage device on an integrated circuit chip, wherein the integrated circuit chip includes a plurality of replicated sub-components that are partially defective, and wherein the integrated circuit chip is functionally equivalent to another integrated circuit chip with an equal number of replicated sub-components as long as a number of available sub-components of a type on the integrated circuit chip and the another integrated circuit chip are equal; identify a set of available sub-components and a set of unavailable sub-components in the plurality of replicated sub-components based on a series of testing; store information about the set of available sub-components and the set of unavailable sub-components within the non-volatile storage device on the integrated circuit chip; read the information from the non-volatile storage device on the integrated circuit chip; configure available sub-components based on the information read from the non-volatile storage device on the integrated circuit chip, wherein configuring is performed by a configuration agent implemented within the integrated circuit chip; and de-configure unavailable sub-components based on the information read from the non-volatile storage device on the integrated circuit chip, wherein de-configuring is performed by the configuration agent implemented within the integrated circuit chip.

9. The data processing system of claim 8, wherein the plurality of replicated sub-components comprise at least one of a processor core, a cache slice, a cache directory structure, and one or more external interfaces, and wherein the one or more external interfaces access at least one of input/output devices, memory, co-processors, and processors.

10. The data processing system of claim 8, wherein the non-volatile storage device on the integrated circuit chip is a serial electrically erasable and programmable read-only memory (SEEPROM).

11. The data processing system of claim 8, wherein the processing unit executes the computer usable code to mark an unavailable sub-component in the plurality of replicated sub-components as an available sub-component in the non-volatile storage device on the integrated circuit chip in response to detecting that the unavailable sub-component becomes available; and configure the available sub-component.

12. The data processing system of claim 8, wherein the processing unit executes the computer usable code to mark an available sub-component in the plurality of replicated sub-components as an unavailable sub-component in the non-volatile storage device on the integrated circuit chip in response to detecting that the available sub-component becomes unavailable; and de-configure the unavailable sub-component.

13. The data processing system of claim 8, wherein the processing unit executes the computer usable code to store concurrent update on demand data indicating a number of licensed and unlicensed sub-components in the plurality of replicated sub-components within the non-volatile storage device on the integrated circuit chip; read the concurrent update on demand data from the non-volatile storage device on the integrated circuit chip to determine the number of licensed sub-component; and initialize hardware to configure only a maximum number of licensed sub-components, wherein remaining sub-components are not available to a user.

14. A computer program product comprising:
a computer storage medium having stored thereon computer usable program code for automatically identifying components, the computer program product including:
computer usable program code for providing a non-volatile storage device on an integrated circuit chip, wherein the integrated circuit chip includes a plurality of replicated sub-components that are partially defective, and wherein the integrated circuit chip is functionally equivalent to another integrated circuit chip with an equal number of replicated sub-components as long as a number of available sub-components of a type on the integrated circuit chip and the another integrated circuit chip are equal
computer usable program code for identifying a set of available sub-components and a set of unavailable sub-components in the plurality of replicated sub-components based on a series of testing;
computer usable program code for storing information about the set of available sub-components and the set of unavailable sub-components within the non-volatile storage device on the integrated circuit chip;
computer usable program code for reading the information from the non-volatile storage device on the integrated circuit chip;

computer usable program code for configuring available sub-components based on the information read from the non-volatile storage device on the integrated circuit chip, wherein the configuring is performed by a configuration agent within the integrated circuit chip; and
computer usable program code for de-configuring unavailable sub-components based on the information read from the non-volatile storage device on the integrated circuit chip, wherein the de-configuring is performed by the configuration agent implemented within the integrated circuit chip.

15. The computer program product of claim 14, wherein the plurality of replicated sub-components comprise at least one of a processor core, a cache slice, a cache directory structure, and one or more external interfaces, and wherein the one or more external interfaces access at least one of input/output devices, memory, co-processors, and processors.

16. The computer program product of claim 14, wherein the non-volatile storage device on the integrated circuit chip is a serial electrically erasable and programmable read-only memory (SEEPROM).

17. The computer program product of claim 14, wherein the integrated circuit chip and the another integrated circuit chip are assigned a same part number so that different combinations of available and unavailable sub-components having a same aggregate function on the integrated circuit chip and the another integrated circuit chip are tracked under the same part number, and wherein the series of testing is performed by one of a manufacturing tester or a service processor.

18. The computer program product of claim 14, further comprising:
computer usable program code for marking an unavailable sub-component in the plurality of replicated sub-components as an available sub-component in the non-volatile storage device on the integrated circuit chip in response to detecting that the unavailable sub-component becomes available; and
computer usable program code for configuring the available sub-component.

19. The computer program product of claim 14, further comprising:
computer usable program code for marking an available sub-component in the plurality of replicated sub-components as an unavailable sub-component in the non-volatile storage device on the integrated circuit chip in response to detecting that the available sub-component becomes unavailable; and
computer usable program code for de-configuring the unavailable sub-component.

20. The computer program product of claim 14, further comprising:
computer usable program code for storing concurrent update on demand data indicating a number of licensed and unlicensed sub-components in the plurality of replicated sub-components within the non-volatile storage device on the integrated circuit chip;
computer usable program code for reading the concurrent update on demand data from the non-volatile storage device on the integrated circuit chip to determine the number of licensed sub-component; and
computer usable program code for initializing hardware to configure only a maximum number of licensed sub-components, wherein remaining sub-components are not available to a user.

* * * * *

UNITED STATES PATENT AND TRADEMARK OFFICE
CERTIFICATE OF CORRECTION

PATENT NO. : 7,624,318 B2
APPLICATION NO. : 11/236449
DATED : November 24, 2009
INVENTOR(S) : Bieswanger et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1093 days.

Signed and Sealed this

Twenty-sixth Day of October, 2010

David J. Kappos
*Director of the United States Patent and Trademark Office*